United States Patent [19]
Kawahara et al.

[11] Patent Number: 5,807,508
[45] Date of Patent: Sep. 15, 1998

[54] COPPER CONDUCTOR PASTE AND PRODUCTION METHOD OF COPPER CONDUCTOR FILM

[75] Inventors: Masahito Kawahara, Osaka; Toru Noguchi; Yoshio Yamaguchi, both of Hyogo; Yoshifumi Yamashita, Osaka; Yoshito Nokami, Wakayama, all of Japan

[73] Assignees: Mitsuboshi Belting Ltd., Hyogo; Okuno Chemical Industries Co., Ltd., Osaka, both of Japan

[21] Appl. No.: 569,291

[22] Filed: Dec. 8, 1995

[51] Int. Cl.$^6$ ............................... H01B 1/20; H01B 1/22
[52] U.S. Cl. .................... 252/512; 252/519.33; 106/1.13
[58] Field of Search .............................. 252/512, 519.33; 106/1.13

[56] References Cited

U.S. PATENT DOCUMENTS

| | | | |
|---|---|---|---|
| 4,172,919 | 10/1979 | Mitchell | 428/209 |
| 4,323,483 | 4/1982 | Rellick | 252/512 |
| 4,877,555 | 10/1989 | Yuhaku et al. | 252/512 |
| 5,261,950 | 11/1993 | Morikawa et al. | 106/1.13 |

FOREIGN PATENT DOCUMENTS

| | | |
|---|---|---|
| 0068167 | 1/1983 | European Pat. Off. . |
| 0131778 | 1/1985 | European Pat. Off. . |
| 0425073 | 5/1991 | European Pat. Off. . |
| 60-70746 | 4/1985 | Japan . |
| 3-50365 | 8/1991 | Japan . |

OTHER PUBLICATIONS

Database WPI, Week 9246, AN 92–377154, Derwent Publications Ltd. JP 4277406 Feb. 10, 1992.
Database WPI, Week 9436, AN 94–288388, Derwent Publications Ltd. JP 6215617 May 8, 1994.
Abstract JP2189808, vol. 14, No. 463, Jul. 25, 1990.
Abstract JP1236513, vol. 13, No. 463, Sep. 21, 1989.
Abstract JP3049108, vol. 15, No. 187, Jul. 18, 1989.

*Primary Examiner*—Mark Kopec
*Attorney, Agent, or Firm*—Sughrue, Mion, Zinn, Macpeak & Seas, PLLC

[57] ABSTRACT

A conductor paste comprising a high-polymer composite obtained by dispersing super-fine-granulated copper oxide in a polymer without being aggregated, mixed copper powders mainly composed of a base copper powder having a mean particle size of 1 to 10 $\mu$m added with at least one kind of an auxiliary copper powder having a mean particle size smaller than that of the base copper powder, and an organic solvent, wherein the wight ratio of the mixed copper powders to copper oxide in the high-polymer composite is 5 to 50 to 1 of copper oxide and the total amount of copper oxide and the mixed copper powders is 50 to 90% by weight of the conductor paste, and a production method a conductor film by coating the conductor paste on the surface of a substrate and after pre-burning the conductor paste under temperature raising, burning the conductor paste to form the conductor film on the substrate.

12 Claims, No Drawings

COPPER CONDUCTOR PASTE AND PRODUCTION METHOD OF COPPER CONDUCTOR FILM

BACKGROUND OF THE INVENTION

1. Field of the Invention

The present invention relates to a copper conductor paste and a production method of a copper conductor film, and more specifically to a copper conductor paste forming conductive paths of a copper film by printing the copper paste onto a ceramic substrate followed by burning and also to a production method of a copper conductor film.

2. Description of the Related Art

Recently, as a conductive paste being applied to electric and electronic parts such as ceramic substrate hybrid IC, ceramic condensers, etc., an Ag—Pd paste mainly composed of silver and palladium, a gold paste, an Ag—Pt paste mainly composed of silver had platinum, and a copper paste are used.

In these pastes, the Ag—Pd paste is a typical paste as a wiring use but has some disadvantages. For example, when the paste is used as wiring on a substrate, silver is ionized with moisture in air. Consequently, a phenomenon called a migration is caused in which the ionized silver migrates to the adjacent conductor paths to cause short-circuiting. Thus, the distance between the conductor paths cannot be narrowed. Also, in a soldering portion for loading or connecting other part onto a conductor path, silver is liable to be corroded with a soft solder and the Ag—Pd paste is inferior in the soldering resistance.

Also, in the case of adhering the foregoing Ag—Pd paste to a substrate, since fine metal particles of a micron size cannot essentially be adhered to a ceramic substrate by causing a reaction, about 4 to 10% by weight a glass frit is compounded with the paste and the glass frit existing on the substrate after printing fives a function of adhering the substrate and the metal film after burning. However, on the other hand, since a large amount of the glass frit remains in the metal film after burning, there occur the problems that the electric resistance of the metal film is increased. Also, since the metal film is adhered to the substrate with a glass layer, a strain is liable to occur by the difference in the thermal expansion and the thermal shock resistance is weakened.

As a paste partially solving such disadvantages, a copper paste is known. The paste is composed of a composition formed by dispersing copper, a glass frit, and a non-copper material such as tungsten, molybdenum, rhenium, etc., in an organic solvent as described, e.g., in Unexamined Japanese Patent Publication (kokai) No. Sho. 60-70746. Also the paste is composed of a composition formed by dispersing metallic copper particles coated with copper oxide, copper oxide particles, and a glass powder in an organic solvent as described in Examined Japanese Patent Publication (kokoku) No. Hei. 3-50365.

However, since in the foregoing copper paste, a large amount of, preferably from 5 to 10% by weight, the glass frit is added as a glass powder and functions for adhering the substrate and the metal film, when the copper paste is coated on a substrate and a metal film is adhered to the substrate by burning, a large amount of the glass frit remains in the metal film after burning and thus there still remain problems that the electric resistance of the metal film is high, also the glass layer existing at the interface between the metal film and the substrate causes a strain by the difference in the thermal expansion, and the heat resistance and the thermal shock resistance are weakened. The thermal shock resistance is evaluated by the adhesive force between the metal film and the substrate after transferring the substrate having adhered thereto the metal film from a low-temperature atmosphere to a high-temperature atmosphere and repeatedly transferring the substrate to the opposite direction.

Also, since a lead borosilicate glass having a low softening point is used as the foregoing glass frit, in the soldering step for an oxidation prevention and Au wire bonding, lead in the foregoing glass inhibits soldering.

SUMMARY OF THE INVENTION

It is an object of this invention to provide a conductive paste which not only improves the adhesive force between a metal film and a substrate but also lowers the electric resistance of the metal film, is excellent in the thermal shock resistance, and does not cause any troubles in processing after soldering, etc., and also to provide a production method of a copper conductor film.

A copper conductor paste of the present invention is comprised of: a polymer composite including a polymer and super-fine-granulated copper oxide, the super-fine-granulated copper oxide being dispersed in the polymer; mixed copper powder including base copper powder having a mean particle size in a range of 1 to 10 µm and at least one kind of auxiliary copper powder having a mean particle size range smaller than that of the base copper powder; and an organic solvent; wherein a weight ratio of the mixed copper powder to copper oxide in the polymer composite is in a range of 5 to 50 to 1 of copper oxide, and a total addition amount of copper oxide and the mixed copper powder is in a range of 50 to 90% by weight of the conductor paste.

In the conductor paste of the present invention, the super-fine particles of copper oxide having particle sizes do not cause separation and precipitation in the paste by the interaction with the polymer and also the conductor paste adheres to a ceramic substrate by causing a reaction owing to the high reactivity of the super-fine particles to be able to form a conductor film having a large adhesive force. Also, by adding mixed copper powders each having a different mean particle size range, the auxiliary copper powders fill the voids and spaces formed by the arrangement of the base copper powders, whereby a conductor film having no inside defects and having a good burned tightness can be obtained.

DETAILED DESCRIPTION OF THE INVENTION

Detailed description of the present invention will be described as follows.

A copper conductor paste of the present invention includes a high polymer composite obtained by dispersing super-fine-granulated copper oxide in a polymer without being aggregated, mixed copper powders mainly composed of a base copper powder having a mean particle size range of from 1 to 10 µm added with at least one kind of an auxiliary copper powder having a mean particle size range smaller than that of the base copper powder, and an organic solvent. In the copper conductor paste, the weight ratio of the mixed copper powder to copper oxide in the foregoing high polymer composite is from 5 to 50 to 1 of copper oxide, and also the total addition amount of copper oxide and the mixed copper powder is from 50 to 90% by weight in the conductor paste.

In addition, in the present invention, a glass powder is added to the conductor paste as described above, and the addition amount of the glass powder is from 0.1 to 1.0 part by weight to 100 parts by weight of the total addition amount of copper oxide and the mixed copper powder.

Further, a production method of a copper conductor film of the present invention uses a conductor paste which is produced by dispersing in an organic solvent at least a high polymer composite obtained by dispersing super-fine-granulated copper oxide in a polymer without being aggregated and mixed copper powders mainly composed of a base copper powder having an average mean particle size range of from 1 to 10 μm added with an auxiliary copper powder having a mean particle size range different from that of the base copper powder. The surface of a substrate is coated with the conductor paste thus produced. After pre-burning the conductor paste under temperature raising, the conductor paste is burned to form a conductor film on the surface of the substrate.

Also, the high polymer composite being used in the present invention may be a high polymer composite produced by preparing a thermodynamically non-equilibrated high polymer layer, and after adhering a metal layer of copper onto the surface of the polymer layer, heating the polymer layer to stabilize the high polymer layer, whereby super-fine particles of copper oxide obtained by super-fine granulating from the metal layer are dispersed from the metal layer in the polymer without being aggregated.

Furthermore, it is preferable that mixed copper powders includes from 80 to 98% by weight a base copper powder having a mean particle size in a range of from 2 to 10 μm based on the amount of the mixed copper powders, from 1 to 10% by weight an auxiliary copper powder having a mean particle size range of from 0.7 to 2 μm based on the amount of the mixed copper powders, and from 1 to 10% by weight an auxiliary copper powder having a mean particle size range of from 0.5 to 1 μm based on the amount of the mixed copper powders.

The high polymer composite which becomes the first component of the conductor paste of this invention is a composite produced by preparing a thermodynamically non-equilibrated high polymer layer and after closely adhering at least a copper metal to the surface of the high polymer layer, heating the high polymer layer to stabilize the high polymer layer, whereby copper oxide composed of $Cu_2O$ or $CuO$ having particle sizes of not larger than 100 nm, and preferably from 1 to 50 nm formed by super-fine-granulated from the copper metal is dispersed in the polymer without being aggregated. The content of super-fine-granulated copper oxide is not more than 90% by weight, and preferably from 0.01 to 90% by weight. Super-fine-granulated copper oxide has a high reactivity at a low temperature, thereby the copper oxide accelerates sintering of the copper powder, and also adheres to a substrate by causing a reaction to form an extremely adherent conductor film.

In the case of producing the high polymer composite described above, it is necessary to form the high polymer layer in a thermodynamically non-equilibrated state. Practically, there are a vapor deposition method of melting and evaporating a high polymer by heating it in a vacuum and solidifying the high polymer layer on a substrate, a melting, quenching and solidifying method of melting a polymer at a temperature higher than the melting point of the polymer, quenching the polymer by immediately placing the molten polymer in that state in liquid nitrogen, etc., and attaching the polymer layer onto a substrate, etc.

In these methods, in the case of the vacuum vapor deposition method, the polymer layer can be obtained on a substrate such as a glass plate, etc., using an ordinary vacuum vapor deposition apparatus at a vacuum of from $10^{-4}$ to $10^{-6}$ Torr and a an evaporation speed of from 0.1 to 100 μm/minute, preferably from 0.5 to 5 μm/minute. In the melting, quenching, and solidifying method, a polymer is melted and the polymer layer is obtained by cooling the molten polymer at a speed higher than the critical cooling speed specific to the polymer. The polymer layer thus obtained is placed in a thermodynamically unstable non-equilibrated state and transfers to the equilibrium state with the passage of time.

The high polymer (or polymer) being used in this invention is, for example, nylon 6, nylon 66, nylon 11, nylon 12, nylon 69, polyethylene terephthalate (PET), polyvinyl alcohol, polyphenylene sulfide (PPS), polystyrene (PS), polycarbonate, and polymethyl methacrylate, and the polymer having the molecular cohesive energy if at least 2,000 cal/mol is preferred. The polymers include ordinary crystalline polymers and noncrystalline polymers. In addition, the molecular cohesive energy is defined in detail in Kagaku Binran Oyo Hen (Chemical Handbook, Application Chapter), page 890, edited by Chemical Society of Japan (published 1973).

Then, the foregoing thermodynamically non-equilibrated high-molecular layer is transferred to the step of adhering a metal layer of copper to the surface thereof. In the step, a metal layer of copper is laminated on the high polymer layer by a method of vapor-depositing a metal layer of copper onto the high polymer layer by a vacuum vapor deposition apparatus or a method of directly adhering a metal foil or a metal plate of copper onto the high polymer layer.

The composite of the high polymer layer and the metal layer of copper adhered onto the high polymer layer is heated to a temperature of from the glass transition point of the high polymer to the pour temperature to stabilize the high polymer layer. As the result thereof, the metal layer of copper becomes super-fine particles of copper oxide having particle sizes of not larger than 100 nm and the maximum particle size distribution in the region of from 1 to 50 nm, and the super-fine particles of copper oxide diffuse and permeate into the inside of the high polymer layer. This state continues until the high polymer layer completely stabilized, and the metal layer of copper adhered to the high molecular layer reduced the thickness and is vanished finally. The foregoing super-fine particles are distributed in the inside of the high polymer layer without being aggregated. In this case, the content of the super-fine particles is from 0.01 to 80% by weight but the content thereof can be controlled by changing the preparation condition of the high polymer layer or changing the thickness of the metal layer of copper.

In addition, when the high polymer layer is heated in the step, the high-molecular layer shows a specific color by the interaction with the super-fine particles of copper oxide, which shows that the super-fine particles of copper oxide is permeated in the inside of the high polymer layer. Also, the color can be changed by the particle sizes of the super-fine particles of copper oxide and the kind of the polymer.

In the present invention, as the production method of the high polymer composite, there are not only the methods described above but also a method of preparing super-fine particles of a noble metal by a vapor-phase method belonging to a melt vaporization method, a liquid-phase method belonging to a precipitation method, a solid-phase method, or a dispersion method and mechanically mixing the super-fine particles with a solution or a molten liquid of a high polymer, a method of simultaneously evaporating a high polymer and a noble metal and mixing them in the vapor phases, etc.

Also, the mixed copper powders which are the second component of the conductor paste of the present invention are mixed copper powder composed of a copper powder having a mean particle size range of from 1 to 10 μm as the base added with at least from 1 to 3 kinds of auxiliary copper powders each having a mean particle size range smaller than that of the base copper powder. The specific mixed copper powders are composed of a base copper powder having a mean particle size range of from 2 to 10 μm and having the largest mean particle size, a first auxiliary copper powder having a mean particle size range of from 1 to 2 μm and having the next larger mean particle size, and a second auxiliary copper powder having a mean particle size range of from 0.5 to 1 μm which is the smallest mean particle size.

In the mixed copper powders, the content of the base copper powder is from 80 to 98% by weight, the content of the first auxiliary copper powder is from 1 to 10% by weight, and the content of the second auxiliary copper powder is from 1 to 10% by weight. In particular, the auxiliary copper powder being used in this invention is not limited to the auxiliary copper powders described above but, for example, a third auxiliary copper powder having a mean particle size range of not larger than 1 μm may be also used. The form of each copper powder of the mixed copper powders described above is preferably near a relatively spherical form. This is for arranging the copper powders with less voids. The use of the mixed copper powders each having a different mean particle size range has an advantage that since the auxiliary copper powders having a smaller mean particle size range fill the voids and spaces formed by the arrangement of the base copper powders having the largest mean particle size range, the conductor film after burning has no inside defects and burned tightness becomes good.

If the mean particle size range of the base copper powder is over 10 μm, the mixed copper powders are reluctant to be influenced by oxidation and the width for establishing the condition of pre-burning may be broadened. However, the mixed copper powders are not sufficiently sintered at a low temperature and the burned tightness becomes insufficient to lower the adhesive force of the conductor film and the substrate. Also, in this case, the copper powders are crushed by an ink rolling step to thereby form copper foils, which sometimes cause mesh clogging at screen printing. On the other hand, if the mean particle size range of the base copper powder is less than 1 μm, the total particle area of the mixed copper powders become too large, whereby the influence of oxidation is increased and the electric resistance becomes high.

Also, if the addition amount of the base copper powder is over 98% by weight, the mixed copper powders are not sufficiently sintered at a low temperature to cause the insufficiency in the burned tightness to lower the adhesive force between the conductor film and the substrate. On the other hand, if the addition amount of the base copper powder is less than 80% by weight, the total particle area of the mixed copper powders becomes too large and the same troubles as described above occur. In addition, the auxiliary copper powders are added for filling the voids and spaces formed in the case of arranging the base copper powders and the mean particle sizes. Accordingly, the addition amount of the auxiliary copper powders give a large influence on the function.

Also, in the present invention, for further improving the adhesive force between the conductor film and the substrate, a glass powder such as a glass frit may be added to the mixed copper powders. The glass powder, which is a third component, has a mean particle size of from 1 to 10 μm and a softening point of from 500° to 700° C. and may contain lead but considering soldering in the post step, it is preferred that the glass powder does not contain lead, which hinders soldering.

The addition amount of the foregoing glass powder is from 0.1 to 5.0 part by weight to 100 parts of the total addition amount of copper oxide and the mixed copper powders. If the addition amount is over 1.0 part by weight, the adhesive force between the conductor film and the substrate is improved. However, since the glass powder yet remains in the inside of the conductor film after burning, the electric resistance of the conductor film tends to increase, also the glass layer existing at the interface between the conductor film and the substrate is liable to cause strain by the thermal expansion difference, and the thermal shock resistance is weakened. On the other hand, if the addition amount of the glass powder is less than 0.1 part by weight, the improvement of the adhesive force cannot be obtained.

The organic solvent being used in the present invention is a high-boiling solvent such as metacresol, dimethylimidazolidinone, dimethylformamide, carbitol, terpinol, diacetone alcohol, triethylene glycol, paraxylene, etc.

The conductor paste of the present invention can be obtained by dissolving the high polymer composite in the foregoing organic solvent and, after uniformly dispersing the super-fine particles of copper oxide in the solution, the mixed copper powders or the mixed copper powders and a glass powder are added to the dispersion with stirring followed uniformly mixing by an ink roll. Copper oxide having the particle size does not cause the separation from the polymer and the precipitation in the conductor paste by the interaction with the polymer.

In this case, the addition amount of the mixed copper powers is determined based on the amount of copper oxide in the high polymer composite and the weight ratio of the mixed copper powders to copper oxide is from 5 to 50 to 1 of copper oxide. If the weight ratio is less than 5, the contents of the organic components in the conductor paste are increased and the electric resistance is increased. On the other hand, if the weight ratio is over 50, the content of copper oxide contributing to adhesion is reduced and thus the burned tightness of the copper powders is reduced.

Also, the total addition amounts of copper oxide and the mixed copper powders is from 50 to 90% by weight of the conductor paste. If the addition amount is less than 50% by weight, the contents of the organic components become large and the burned film becomes porous. On the other hand, if the addition amount is over 90% by weight, the printability is reduced.

The conductor paste obtained is coated on a ceramic substrate such as alumina, aluminum nitrate, silicon carbonate, silicon nitride, saialone, barium titanate, PBZT, etc., by screen printing, etc. In the procedure of screen printing, a printing substrate is placed under a screen (e.g., polyester plain weave fabric, 255 mesh) horizontally disposed. After placing the conductor paste on the screen, the paste is spread over the whole surface of the screen using a squeegee. In this case, the screen is placed over the printing substrate with a space. Then, the squeegee is pressed to an extent of contacting the screen with the printing substrate and moved to perform printing. Thereafter, the operation is repeated.

The printed substrate is pre-burned in an oven kept at a temperature of from 50° to 90° C. In the pre-burning step, the temperature is gradually raised to a temperature of from 200° to 500° C. at a temperature raising speed of from 2° to 20° C./minute and the substrate is maintained at the temperature for maximum 60 minutes, during which, the decomposition action of the organic components is controlled. Thereafter, the pre-burned substrate is placed in a belt furnace and burned in a nitrogen atmosphere at a temperature of from 750° to 950° C. for 5 to 20 minutes (peak keeping time) to sinter the copper powders and adhere the copper powders to the substrate by causing a reaction.

In addition, in the present invention, by adding a binder resin to the conductor paste, the printability can be improved. As the binder resin, there are, for example, celluloses such as nitrocellulose, ethyl cellulose, cellulose acetate, butyl cellulose, etc.; polyethers such as polyoxyethylene, etc.; polyvinyls such as polybutadiene, polyisoprene, etc.; polyacrylates such as polybutyl acrylate, polymethyl acrylate, etc.; and polyamides such as nylon 6, nylon 6.6, nylon 11, etc.

In the conductor paste of the present invention, the super-fine particles of copper oxide having particle sizes of not larger than 100 nm do not cause separation and precipitation in the paste by the interaction with the polymer and can adhere to a ceramic substrate by causing a reaction owing to the high reactivity of the super fine particles to form a conductor film with a large adhesive force. Also, by adding the mixed copper powders each having a mean particle size range, the auxiliary copper powders contained in the mixed copper powders fill the voids and spaces formed by the arrangement of the base copper powders and a conductor film having no inside defects and a good burned tightness can be obtained.

Furthermore, in the conductor paste added with a glass powder, the adhesive force between the conductor film and the substrate can be more improved and also since the addition amount of the glass powder is very small as compared with conventional conductor pastes, the conductor paste of this invention is excellent in the soldering property, the electric resistance of the conductor film is low, and also since a clear layer of the glass powder is not formed at the interface between the conductor film and the substrate, the thermal shock resistance is also improved. Also, since the glass powder being used in this invention does not contain lead or if the glass powder contains lead, the amount thereof is slight, a soldering treatment for carrying out the oxidation prevention and Au wire bonding can be stably applied.

Also, since in this invention, the conductor paste is coated on the surface of the substrate and after pre-burning it under temperature raising, the substrate thus coated with the conductor paste is burned to form a conductor film on the surface of the substrate, pre-burning decomposes and controls the organic components such as the polymer, the organic solvent, etc., whereby a conductor film having no inside defects, a good burned rightness, and a high adhesive force can be obtained. Also, the control of the oxygen concentration at burning is unnecessary.

Then, the present invention is explained in more detail by the following practical examples.

EXAMPLES 1 TO 4

(Preparation of High Polymer Composite)

Using a vacuum vapor-deposition apparatus, 5 g of the polymer pellets of nylon 11 were placed in a tungsten boat and the apparatus was evacuated to $1\times10^{-6}$ Torr. Then, the tungsten boat was heated by applying a voltage thereto to melt the polymer pellets and thus a vapor-deposited high polymer layer having a thickness of about 5 $\mu$m was formed on the substrate (glass plate) placed on the upper portion of the bottom stand at a vacuum of from $1\times10^{-4}$ to $1\times10^{-6}$ Torr at a speed of about 1 $\mu$m/minute. The molecular weight of the polymer layer was from about ½ to ⅒ of that of the foregoing polymer pellets.

Furthermore, copper chips were placed in a tungsten boat and melted by heating to carry out the vapor deposition at a vacuum of from $1\times10^{-4}$ to $1\times10^{-6}$ Torr, whereby a copper vapor-deposited film was attached onto the polymer layer. The vapor-deposited substrate was taken out from the vacuum vapor-deposition apparatus and allowed to stand in a chamber kept at 120° C. for 10 minutes to provide a composite. As the result, the high polymer composite thus obtained contained 55% by weight $Cu_2O$ and the particle sizes of the copper oxide particles in the polymer were from 1 to 15 nm.

(Preparation of Conductor Paste)

The high polymer composite containing 60% by weight obtained in the above step was mixed with mixed copper powders while controlling such that the weight ratio of $Cu_2O$ in the polymer composite to the mixed copper powders became 1 to 12.5 and the total addition amount of $Cu_2O$ and the mixed copper powders became 82% by weight of the conductor paste. In this case, as the mixed copper powders, four kinds of mixed copper powders composed of a base copper powder and two kinds of auxiliary copper powders were used.

After dispersing each of the four kinds of the mixed copper powders in meta-cresol as an organic solvent with stirring, the dispersion was further uniformly mixed with an ink roll to provide each brown conductor paste. The content of meta-cresol in each conductor paste obtained was 13% by weight of the conductor paste. The compositions of the conductor pastes obtained above are shown in Table 1 below.

(Preparation of Conductor Film)

Each conductor paste obtained above was screen-printed onto an aluminum substrate using a screen of stainless steel 300. The substrate thus printed was pre-burned in an oven kept at 260° C. for 15 minutes. Thereafter, the pre-burned substrate was placed in a belt furnace and burned in a nitrogen atmosphere, at an oxygen concentration of from 0 to 10 ppm, a burning temperature of 850° C. for a peak retention time of 15 minute to form a conductor film on the substrate.

(Evaluation Method)

The adhesive force of the conductor film and the electric resistance of the conductor film after burning, and the thermal shock resistance thereof were measured by the following methods.

1. Adhesive force of conductor film after burning (L-type peal strength):

A tin-plated copper wire having a diameter of 0.6 mm was fixed on the conductive film formed on the surface of the substrate by soldering in a size of 2 mm×2 mm and the adhesive force of the copper wire bent perpendicularly was measured by a spring balance to determine the adhesive force between the substrate and the conductor film.

2. Electric resistance of conductor film:

A film having a thickness of 15 $\mu$m and a diameter of 1.5 cm was prepared and the electric resistance was measured by a four probe method.

The results obtained by the above evaluation methods are shown in Table 2 below.

COMPARATIVE EXAMPLE 1

The high polymer composite containing 60% by weight $Cu_2O$ described above was mixed with a copper powder having a mean particle size of 3 μm while controlling such that the weight ratio of $Cu_2O$ in the polymer composite to the copper powder became 1 to 12.5 and the total addition amount of $Cu_2O$ and the copper powder became 82% by weight of the conductor paste.

After dispersing the mixture in meta-cresol as an organic solvent with stirring, the dispersion was further uniformly mixed with an ink roll to provide a brown conductor paste. The content of meta-cresol in the conductor paste obtained was 13% by weight.

Also, a conductor film wad formed on a substrate as in Example 1 and the adhesive force of the conductor film and the electric resistance of the conductor film were measured.

The results obtained are shown in Table 2 below.

TABLE 1

| Polymer Composite | | Mixed Copper Powder (weight ratio) | | | | | Organic Solvent |
|---|---|---|---|---|---|---|---|
| $Cu_2O$ | Nylon 11 | 7 μm | 5 μm | 3 μm | 1 μm | 0.5 μm | meta-cresol |
| Ex.1 | 0.60 | 0.40 | 6.485 (100) | — | — | 0.260 (4) | 0.130 (2) | 1.20 |
| Ex.2 | 0.60 | 0.40 | — | 6.486 (100) | — | 0.260 (4) | 0.130 (2) | 1.20 |
| Ex.3 | 0.60 | 0.40 | — | — | 6.486 (100) | 0.260 (4) | 0.130 (2) | 1.20 |
| Ex.4 | 0.60 | 0.40 | — | — | 6.486 (100) | 1.30 (2) | 0.260 (4) | 1.20 |
| Comp. Ex. 1 | 0.60 | 0.40 | — | — | 6.875 | — | — | 1.20 |

(*): The numeral in the parenthesis in the mixed copper powders shows a weight ratio.
Ex.: Example Comp. Ex.: Comparative Example

TABLE 2

| | Printability | L-Type Peal Strength (kg/2 × 2 mm²) | Sheet Resistance (mΩ/□) |
|---|---|---|---|
| Example 1 | good | 0.5 | 1 |
| Example 2 | good | 1.5 | 1 |
| Example 3 | good | 1.6 | 1 |
| Example 4 | good | 2.1 | 1 |
| Comparative Example 1 | good | 1.5 | 2 |

As the results thereof, it can be seen that by using the mixed copper powders, the adhesive force of the conductor film is increased and the electric resistance thereof is lowered.

EXAMPLES 5 TO 10

(Preparation of Conductor Paste)

The high polymer composite containing 60% by weight $Cu_2O$ as used in Example 1 was mixed with mixed copper powders while controlling such that the weight ratio of $Cu_2O$ in the polymer composite to the mixed copper powders became 1 to 12.5 and the total addition amount of $Cu_2O$ and the mixed copper powders became 82% by weight of the conductor paste. As the mixed copper powders, mixed copper powders obtained by mixing a base copper powder having a mean particle size of 3 μm, an auxiliary copper powder having a mean particle size of 1 μm, and an auxiliary copper powder having a mean particle size of 0.5 μm at a blending ratio of 100:2:4 were used.

Also, as a glass powder, various glass frits shown in Table 3 were used. After dispersing the foregoing mixture and the glass powder in meta-cresol as an organic solvent with stirring, the dispersion was further uniformly mixed with an ink roll to provide each brown conductor paste. The content of meta-cresol in the conductor paste was 13% by weight.

(Preparation of Conductor Film)

Each conductor paste was screen printed on an alumina substrate using a stainless steel screen of 150 mesh. The printed substrate was pre-burned in an oven. In the pre-burning step, the temperature was gradually raised from 80° C. at a temperature raising speed of 5° C./minute and the substrate was kept at 260° C. for 6 minutes, during which the decomposition behavior of the organic components was controlled. Thereafter, the pre-burned substrate was placed in a belt furnace and burned in a nitrogen atmosphere at a burning temperature of 850° C. for 15 minutes to form a conductor film on the substrate.

The adhesive force of the conductor film obtained and the electric resistance of the conductor film are shown in Table 4.

TABLE 3

| Sample No. | N-1 | N-2 | N-3 | N-4 | L-1 | L-2 |
|---|---|---|---|---|---|---|
| Particle Size (μ) | 4.6 | 4.1 | 5.2 | 2.3 | 2.7 | 2.7 |
| Softening Point (°C.) | 585 | 529 | 600 | 673 | 555 | 537 |
| Thermal Expansion Coefficient (α) | 67 | 86 | 76 | 49 | 72 | 82 |
| Lead | none | none | none | none | used | used |

TABLE 4

| | Glass Frit Sample No. | L-Type Peal Strength (kg/2 × 2 mm²) | Sheet Resistance (mΩ/□) |
|---|---|---|---|
| Example 5 | N-1 | 5.3 | 1 |
| Example 6 | N-2 | 4.4 | 1 |
| Example 7 | N-3 | 6.3 | 1 |
| Example 8 | N-4 | 3.5 | 1 |
| Example 9 | L-1 | 1.9 | 1 |
| Example 10 | L-2 | 2.9 | 1 |

As the results shown above, it can be seen that in the conductor pastes of this invention, every kinds of the glass frits can be used but by using the glass frit having a thermal expansion coefficient near the thermal expansion coefficient (α), $76 \times 10^{-7}$ $K^{-1}$ of the alumina substrate, the thermal shock resistance is excellent.

EXAMPLES 11 TO 15

The high polymer composite containing 60% by weight $Cu_2O$ as in Example 1 was mixed with mixed copper powders while controlling such that the weight ratio of $Cu_2O$ in the polymer composite to the mixed copper powders became 1 to 12.5 and the total addition amount of $Cu_2O$ and the mixed copper powders became 82% by weight of the conductor paste. As the mixed copper powders, mixed copper powders obtained by mixing a base copper powder having a mean particle size of 3 μm, an auxiliary copper powder having a mean particle size of 1 μm, and an auxiliary copper powder having a mean particle size of 0.5 μm at a blending ratio of 100:2:4, and mixed copper powders obtained by mixing a base copper powder having a mean particle size of 5 μm, an auxiliary copper powder having a mean particle size of 1 μm, and an auxiliary copper powder having a mean particle size of 0.5 μm at a blending ratio of 100:2:4 were used, respectively.

Also, as a glass powder, a glass frit (particle size 5.2 μm, softening point 600° C., thermal expansion coefficient (α) 76, lead free) was added to each of the foregoing mixed copper powders in an amount of 0.2% by weight, 0.5% by weight, and 1.0% by weight, respectively, of the total amount of copper oxide and the mixed copper powders.

After dispersing each of the mixtures in meta-creosol as an organic solvent, each dispersion was further uniformly mixed with an ink roll to provide each brown conductor paste. The content of meta-cresol in the conductor paste obtained was 13% by weight.

The compositions of the foregoing conductor pastes are shown in Table 5 below.

(Preparation of Conductor Film)

Each conductor paste was screen printed on an alumina substrate using a stainless steel screen of 150 mesh. The printed substrate was pre-burned in an oven. In the pre-burning step, the temperature was gradually raised from 80° C. at a temperature raising speed of 5° C./minute and the substrate was kept at 260° C. for 6 minutes, during which the decomposition behavior of the organic components was controlled. Thereafter, the pre-burned substrate was placed in a belt furnace and burned in a nitrogen atmosphere at a burning temperature of 850° C. for 15 minutes to form a conductor film on the substrate.

The results of measuring the adhesive force of the conductor film obtained, the electric resistance of the conductor film, and the thermal shock resistance thereof were measured are shown in Table 6 below.

(Evaluation Method)

The thermal shock resistance of each conductor film after burning was measured by the following method.

Ni—Au plating was applied onto the conductor film of each substrate, after solder lapping it, the substrate thus treated was allowed to stand in an atmosphere of 150° C. for 30 minutes, and then allowed to stand in an atmosphere of −55° C. for 30 minutes, and after applying the heating and cooling operations at 1000 cycles. the adhesive force between the substrate and the conductor film was determined by the foregoing L-type peal strength.

COMPARATIVE EXAMPLE 2

As shown in Table 5 below, a high polymer composite was not used, mixed copper powders obtained by mixing a base copper powder having a mean particle size of 3 μm, an auxiliary copper powder having a mean particle size of 1 μm, and an auxiliary copper powder having a mean particle size of 0.5 μm at blending ratio of 100:2:4 were used in an amount of 81% by weight of the conductor paste, a glass frit (particle size 5.2 μm, softening point 600° C., thermal expansion coefficient (α) 76×10$^{-7}$ K$^{-1}$, lead free) was used in an amount of 0.2% by weight, 0.5 by weight, and 1.0% by weight, respectively, of the mixed copper powders, and nylon 11 was used in an amount of 5% by weight of the conductor paste.

After dispersing each of the mixtures in meta-cresol as an organic solvent, the dispersion was further uniformly mixed with an ink roll to provide each brown conductor paste. The content of meta-cresol in the conductor paste obtained was 14% by weight.

A conductor film was formed on a substrate as in the foregoing examples and the adhesive force of the conductor film and the electric resistance of the conductor film was measured.

The results are shown in Table 6 below.

TABLE 5 (1)

|  | Polymer Composite | | Mixed Copper Powders*1 (weight ratio) | | | |
| --- | --- | --- | --- | --- | --- | --- |
|  | Cu$_2$O | Nylon 11 | 5 μm | 3 μm | 1 μm | 0.5 μm |
| Example 11 | 0.60 | 0.40 | — | 6.486 (100) | 0.130 (2) | 0.260 (4) |
| Example 12 | 0.60 | 0.40 | — | 6.486 (100) | 0.130 (2) | 0.260 (4) |
| Example 13 | 0.60 | 0.40 | — | 6.486 (100) | 0.130 (2) | 0.260 (4) |
| Example 14 | 0.60 | 0.40 | — | 6.486 (100) | 0.130 (2) | 0.260 (4) |
| Example 15 | 0.60 | 0.40 | 6.486 (100) | | 0.130 (2) | 0.260 (4) |
| Comparative Example 2 | — | 0.50 | — | 6.486 (100) | 0.130 (2) | 0.260 (4) |

TABLE 5 (2)

|  | Organic Solvent | Glass Frit*2 | |
| --- | --- | --- | --- |
| (weight ratio) | Meta-cresol | N-3 | N-4 |
| Example 11 | 1.20 | 0.74 | — |
| Example 12 | 1.20 | — | 0.74 |
| Example 13 | 1.20 | 0.37 | — |
| Example 14 | 1.20 | 0.15 | — |
| Example 15 | 1.20 | 0.74 | — |
| Comparative Example 2 | 1.20 | | 0.74 |

*1: The numeral in the parenthesis in the mixed copper powders shows a weight ratio.
*2: The addition amount of the glass frit is the amount to 100 parts by weight of the total addition amounts of copper oxide and the mixed copper powders and shown as parts by weight.

TABLE 6

| | L-Type Peal Strength | Sheet Resistance | Thermal Stock Resistance Adhesive Force (kg/2 × 2 mm$^2$) Cycle Number | | | | | |
| --- | --- | --- | --- | --- | --- | --- | --- | --- |
| | kgf/2 × 2 | (mΩ/□) | 0 | 50 | 100 | 200 | 500 | 1000 |
| Ex. 11 | 4.6 | 1 | 3.7 | 3.1 | 3.5 | 4.1 | 4.5 | 2.1 |
| Ex. 12 | 3.5 | 1 | 1.5 | 1.6 | 1.4 | 1.0 | 0.5 | 0.4 |
| Ex. 13 | 3.9 | 1 | | | | | | |
| Ex. 14 | 1.9 | 1 | | | | | | |
| Ex. 15 | 3.6 | 1 | | | | | | |
| Comp. Ex. 12 | 0.1 | 3 | | | | | | |

As the results shown above, it can be seen that in the conductor pastes of this invention, even when the content of the glass frit is less than 1.0% by weight, the conductor film sufficiently adhere to the substrate after burning, the electric resistance of the conductor film is low, and the conductor film is excellent in the thermal shock resistance.

Also, it can be seen that in the conductor paste without using a high polymer composite, the adhesive force of the conductor film is low.

As described above in detail, in the conductor paste of the present invention, the super-fine particles of copper oxide having particle sizes of not larger than 100 nm do not cause separation and precipitation in the paste by the interaction with the polymer and also the conductor paste adheres to a ceramic substrate by causing a reaction owing to the high reactivity of the super-fine particles to be able to form a conductor film having a large adhesive force. Also, by adding mixed copper powders each having a different mean particle size range, the auxiliary copper powders fill the voids and spaces formed by the arrangement of the base copper powders, whereby a conductor film having no inside defects and having a good burned tightness can be obtained.

Furthermore, by adding a glass powder to the conductor paste, the adhesive force between the conductive film formed and the substrate can be more improved and further since the addition amount of the glass powder is very small as compared with conventional cases, the electric resistance of the conductor film is lowered and since a clear layer of the glass powder is not formed at the interface between the conductor film and the substrate, the thermal shock resistance is improved. Also, since the glass powder contains no lead or if contains, the amount of lead is very slight, the conductive film is excellent in the soldering property and a plating treatment, which is carried out for the oxidation prevention and wire bonding, can be stably applied.

Moreover, in the production method of the conductor film of this invention, since the conductor paste is coated on a substrate and after pre-burning the substrate under temperature raising, the pre-burned substrate is burned to form a conductor film on the surface of the substrate, pre-burning decomposes and controls the organic components of the polymer and the organic solvent, whereby a conductor film having no inside defects, a good burned tightness, and a high adhesive force can be obtained.

What is claimed is:

1. A copper conductor paste comprising:
   a polymer composite including a polymer and super-fine-granulated copper oxide, said super-fine-granulated copper oxide being dispersed in said polymer;
   mixed copper powder including base copper powder having a mean particle size in a range of 1 to 10 µm and at least one kind of auxiliary copper powder having a mean particle size range smaller than that of said base copper powder; and
   an organic solvent.

2. A copper conductor paste according to claim 1, further comprising glass powder wherein the amount of said glass powder is in a range of 0.1 to 5.0 parts by weight to 100 parts by weight of the total addition amounts of said copper oxide and said mixed copper powder.

3. A copper conductor paste according to claim 2, wherein said glass powder has a mean grain size in a range of 1 to 10 µm and a softening point in a range of 200° to 700° C.

4. A copper conductor paste according to claim 1, wherein said polymer composite is obtained by preparing a thermodynamically non-equilibrated high-polymer layer, and after adhering a metal layer of copper onto a surface of said high-polymer layer, heating said high-polymer layer to stabilize the high-polymer, whereby super-fine particles of copper oxide, super-fine granulated from the metal layer, are dispersed in said polymer.

5. A copper conductor paste according to claim 4, wherein said super-fine-granulated copper oxide is super-fine particles of $Cu_2O$ having a mean particle size equal to or less than 100 nm, and is contained in said polymer composite in an amount in a range of 0.01 to 90% by weight.

6. A copper conductor paste according to claim 2, wherein said polymer composite is obtained by preparing a thermodynamically non-equilibrated high-polymer layer, and after adhering a metal layer of copper onto a surface of said high-polymer layer, heating said high-polymer layer to stabilize the high-polymer, whereby super-fine particles of copper oxide, super-fine granulated from the metal layer, are dispersed in said polymer.

7. A copper conductor paste according to claim 6, wherein said super-fine-granulated copper oxide is super-fine particles of $Cu_2O$ having a mean particle size equal to or less than 100 nm, and is contained in said polymer composite in an amount in a range of 10 to 90% by weight.

8. A copper conductor paste according to claim 1, wherein said mixed copper powder includes said base copper powder having a mean particle size range of from 2 to 10 µm in an amount of from 80 to 98% by weight of said mixed copper powder, a first auxiliary copper powder having a mean particle size range of from 0.7 to 2 µm in an amount of from 1 to 10% by weight of said mixed copper powder, and a second auxiliary copper powder having a mean particle size range of from 0.2 to 0.7 µm in an amount of from 1 to 10% by weight of said mixed copper powder.

9. A copper conductor paste according to claim 2, wherein said mixed copper powder includes said base copper powder having a mean particle size range of from 2 to 10 µm in an amount of from 80 to 98% by weight of said mixed copper powder, a first auxiliary copper powder having a mean particle size range of from 0.7 to 2 µm in an amount of from 1 to 10% by weight of said mixed copper powder, and a second auxiliary copper powder having a mean particle size range of from 0.2 to 0.7 µm in an amount of from 1 to 10% by weight of said mixed copper powder.

10. A copper conductor paste according to claim 3, wherein said polymer composite is obtained by preparing a thermodynamically non-equilibrated high-polymer layer, and after adhering a metal layer of copper onto a surface of said high-polymer layer, heating said high-polymer layer to stabilize the high-polymer, whereby super-fine particles of copper oxide, super-fine granulated from the metal layer, are dispersed in said polymer.

11. A copper conductor paste according to claim 10, wherein said mixed copper powder includes said base copper powder having a mean particle size range of from 2 to 10 µm in an amount of from 80 to 98% by weight of said mixed copper powder, a first auxiliary copper powder having a mean particle size range of from 0.7 to 2 µm in an amount of from 1 to 10% by weight of said mixed copper powder, and a second auxiliary copper powder having a mean particle size range of from 0.2 to 0.7 µm in an amount of from 1 to 10% by weight of said mixed copper powder.

12. A copper conductor paste according to claim 1, wherein a weight ratio of said mixed copper powder to copper oxide in said polymer composite is in a range of 5 to 50 to 1 of copper oxide, and a total addition amount of copper oxide and said mixed copper powder is in a range of 50 to 90% by weight of said conductor paste.

* * * * *